United States Patent [19]
Kingsley et al.

[11] Patent Number: 5,610,403
[45] Date of Patent: Mar. 11, 1997

[54] SOLID STATE RADIATION IMAGER WITH GATE ELECTRODE PLANE SHIELD WIRES

[75] Inventors: Jack D. Kingsley, Grand Junction, Colo.; George E. Possin, Niskayuna, N.Y.

[73] Assignee: General Electric Company, Schenectady, N.Y.

[21] Appl. No.: 523,323

[22] Filed: Sep. 5, 1995

[51] Int. Cl.$^6$ .......................... H01L 31/0224; G01T 1/24
[52] U.S. Cl. ................. 250/370.09; 250/370.08; 250/208.1
[58] Field of Search .................. 250/370.08, 370.09, 250/208.1; 257/446, 448

[56] References Cited

U.S. PATENT DOCUMENTS

| | | | |
|---|---|---|---|
| 5,136,358 | 8/1992 | Sakai et al. | 257/659 |
| 5,313,319 | 5/1994 | Salisbury . | |
| 5,389,775 | 2/1995 | Kwasnick et al. . | |

FOREIGN PATENT DOCUMENTS

| | | | |
|---|---|---|---|
| 63-186468 | 8/1988 | Japan | 257/448 |
| 2-192764 | 7/1990 | Japan | 257/446 |

OTHER PUBLICATIONS

Application entitled, "Flat Planel Imaging Device With Ground Plane Electrode," Serial No. 08/523,324, filed Sep. 5, 1995.

Application entitled, "Solid State Fluoroscopic Radiation Imager With Thin Film Transistor Addressable Array," Serial No. 08/174,921, Dec. 29, 1993.

Primary Examiner—Edward J. Glick
Attorney, Agent, or Firm—Donald S. Ingraham

[57] ABSTRACT

A solid state radiation imager that exhibits reduced capacitive coupling between pixel photodiodes and readout data lines, and thus further has reduced phantom images or image artifacts, includes a plurality of shield lines disposed at the same level of the device as the scan lines and associated gate electrodes for the switching transistors. The shield lines include respective pixel shielding spurs oriented along the same axis as the data lines and disposed between portions of the pixel photodiode and adjacent portions of the data lines. The shield lines are typically coupled to a shield voltage source such that the shield lines are maintained at a common potential.

12 Claims, 3 Drawing Sheets

SOLID STATE RADIATION IMAGER WITH GATE ELECTRODE PLANE SHIELD WIRES

BACKGROUND OF THE INVENTION

This invention relates generally to solid state radiation imagers and in particular to structures in such imagers to reduce phantom noise and image artifacts.

Solid state radiation imagers typically comprise a large flat panel imaging device having a plurality of pixels arranged in rows and columns. Each pixel includes a photosensor, such as a photodiode, that is coupled via a switching transistor to two separate address lines, a scan line and a data line. In each row of pixels, each respective switching transistor (typically a thin film field effect transistor (FET)) is coupled to a common scan line through that transistor's gate electrode. In each column of pixels, the readout electrode of the transistor (e.g., the source electrode of the FET) is coupled to a data line. During nominal operation, radiation (such as an x-ray flux) is pulsed on and the x-rays passing through the subject being examined are incident on the imaging array. The radiation is incident on a scintillator material and the pixel photosensors measure (by way of change in the charge across the diode) the amount of light generated by x-ray interaction with the scintillator. Alternatively, the x-rays can directly generate electron-hole pairs in the photosensor (commonly called "direct detection"). The photosensor charge data are read out by sequentially enabling rows of pixels (by applying a signal to the scan line causing the switching transistors coupled to that scan line to become conductive), and reading the signal from the respective pixels thus enabled via respective data lines (the photodiode charge signal being coupled to the data line through the conductive switching transistor and associated readout electrode coupled to a data line). In this way a given pixel can be addressed though a combination of enabling a scan line coupled to the pixel and reading out at the data line coupled to the pixel.

The performance of flat panel imaging devices is degraded by capacitive coupling between data lines and the pixel photodiode electrodes. In particular, during some common imager operations the x-ray flux remains on during readout of the pixels. One example of such operations is fluoroscopy in small or less sophisticated units as might be used in surgery or portable applications; such units use light weight and low cost x-ray generators which must be on continuously to produce an adequate output signal. Such units further typically are not adapted to rapidly cycle the x-ray beam on and off during relevant periods to prevent radiating during the readout periods. Another example are imagers used in conjunction with radiation therapy in which the radiation source is on continuously (to maximize delivered dose) or is pulsed on periodically, which pulses can occur during the readout period. This simultaneous excitation of the imager while reading out pixels results in image artifacts or "phantom" images. The phantom images occur as a result of capacitive coupling between the respective photodiode electrodes and adjacent data lines; during the readout of a given pixel attached to a given data line, the potential of the other pixel electrodes (e.g., the non-read pixels) continue to change as the radiation flux strikes the imager. The change in potential of the pixels not being read out is capacitively coupled into the data line, thereby inducing an additional charge which is read out by the amplifier and presented as part of the signal from the addressed pixel. This effect produces cross-talk or contrast degradation in the image, and is commonly evidenced as bright lines in the display readout.

It is desirable that a solid state imager array exhibit minimal cross-talk and be capable of generating a stable and accurate image in multiple modes of operation, including modes in which pixels are being read out while the x-ray flux is being applied.

SUMMARY OF THE INVENTION

A solid state radiation imager that exhibits reduced capacitive coupling between pixel photodiodes and readout data lines, and thus further has reduced phantom images or image artifacts, includes a plurality of shield lines disposed at the same level of the device as the scan lines and associated gate electrodes for the switching transistors. The shield lines include respective pixel shielding spurs oriented along the same axis as the data lines and disposed between portions of the pixel photodiode and adjacent portions of the data lines. The shield lines are separated from adjacent portions of scan lines by a shield line gap distance. The shield line typically includes a bus portion that is oriented along the same axis as the scan lines, or alternatively, along the axis of the data lines, with the shield line spurs extending from the bus portion. The shield lines are typically coupled to a shield voltage source such that the shield lines are maintained at a common potential. The shield lines typically comprise the same conductive material as the scan lines and are fabricated during the imager array fabricating process coincidentally with the deposition and patterning of the scan line conductive material.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
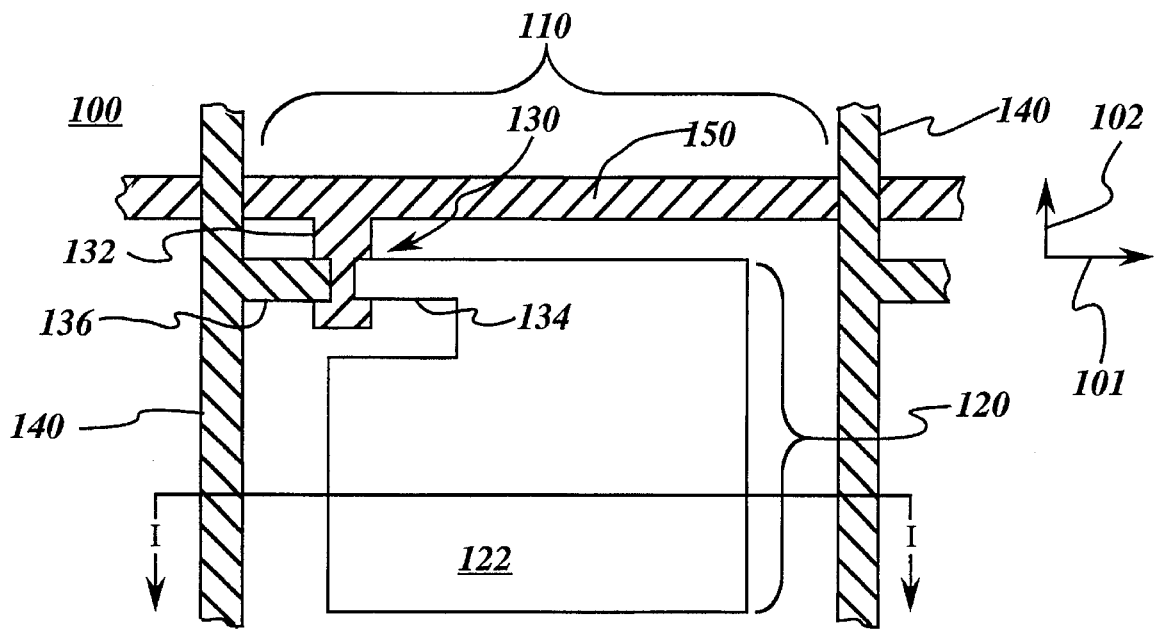
FIG. 1(A) is a plan view of a portion of an imager array in accordance with the prior art.

A solid state radiation imager 100 comprises a plurality of pixels 110 (a representative one of which is illustrated in FIG. 1(A)) that are arranged in a matrix-like imager array pattern comprising rows and columns of pixels 110. For purposes of illustration and not limitation, imager 100 has a first axis 101 that is the axis along which the rows of pixels are aligned, and a second axis 102 that is the axis along which the columns of pixels are aligned. Each pixel 110 comprises a photosensor 120 and a thin film switching transistor 130. Photosensor 120 typically comprises a photodiode having a pixel electrode 122 that corresponds with the active (that is, photosensitive) area of the device. Switching transistor 130 typically comprises a thin film field effect transistor (FET) having a gate electrode 132, a drain electrode 134 and a source electrode (or readout electrode) 136. Imager 100 further comprises a plurality of data lines 140 and scan lines 150. At least one scan line 150 is disposed along first axis 101 for each row of pixels in the imager array pattern. Each scan line is coupled to the respective gate electrodes 132 of pixels in that row of pixels. At least one data line is disposed along second axis 102 for each column of pixels in the imager array pattern, and is coupled to the respective readout electrodes 136 of pixels in that column of pixels.

Figure 1B:
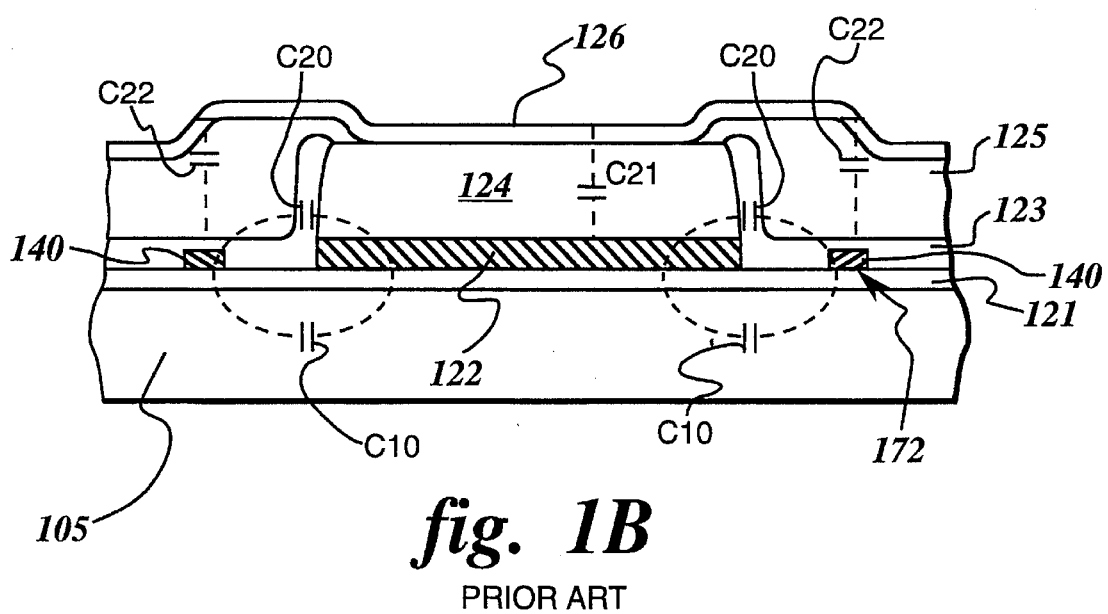
FIG. 1(B) is a partial cross-sectional view of a representative pixel taken along line I—I of FIG. 1(A).

A partial cross-sectional view of one pixel 110 is presented in FIG. 1(B). Photodiode 120 is disposed over a substrate 105. For ease of illustration, dielectric material layers that may be disposed between pixel electrode 122 and substrate 105 are illustrated with a generic first material layer 121. Photodiode further comprises a photosensitive material body 124 (typically comprising amorphous silicon) that is electrically coupled to a common electrode 126 (typically comprising indium tin oxide) that is disposed over the imager array. A second dielectric material layer 123, typically comprising silicon nitride or the like, extends over a portion of the sidewalls of the photosensitive material body 124, and a third dielectric layer 125, comprising polyimide or the like, is disposed between common electrode 126 and other components in the imager array (except for the contact point to photosensitive material body 124 through a via in second dielectric material layer 123 and third dielectric layer 125).

In an imager array as illustrated in FIG. 1(B), there are several sources of capacitive coupling between conductive components in the array. For example, there is capacitive coupling between each data line 140 and adjacent pixel electrodes 122. As used herein, "adjacent" conductive components refers to components that are spatially near one another but not in direct physical contact so that no direct conductive path (or short circuit) exists between the two components. For analysis purposes, the coupling between a data line and an adjacent photodiode base electrode is broken down into a first capacitance $C_{10}$ (the representation in phantom in FIG. 1(B) is for illustrative purposes and does not represent a separate capacitor component in the array) that predominantly represents coupling though the substrate and materials disposed under the pixel electrode 122 (as used herein, "under", "over", "above" and the like are used to refer to the relative position of a component with respect to the substrate, and does not in any way connote any limitation on the orientation, use, or operation of the imager array). A second capacitance $C_{20}$ denotes capacitive coupling through array elements above base electrode 122. It has been observed that the "lower" path capacitance, $C_{10}$, frequently is a larger contributor to induced capacitance than the "upper" path capacitance, $C_{20}$. Other sources of capacitive coupling are between pixel electrode 122 and common electrode 126 (denoted as $C_{21}$ in FIG. 1(B)) and between data line 140 and common electrode 126 (denoted as $C_{22}$ in FIG. 1(B)). The total pixel capacitance (exclusive of typically small parasitic capacitance to scan lines) is expressed as:

$$C_{pixel} = 2(C_{10} + C_{20}) + C_{21}$$

$C_{pixel}$ is dominated by $C_{21}$ (base electrode to common electrode) because the pixel electrode area is much larger than the data line area. The total pixel capacitance is a function of the induced capacitance to data lines on either side of the pixel, hence factor of two with respect to the sum of $C_{10}$ and $C_{20}$.

The capacitive coupling effect is most often of concern in operations in which the imager is excited (that is, the radiation of interest (e.g., x-rays) are incident on the imager) during all or a portion of the time the pixels are being read out. The signal read out during the period of time that the imager is excited will be larger than when the imager is not being excited. One approximation of the increase normalized to average signal can be expressed as:

$$2[\{C_{10}+C_{20}/C_{pixel}\}]\times[\text{\#pixels per readout channel/\#of scan lines with pixels exposed radiation beam}]\times[\text{integration time/line scan time}]$$

The expression $(C_{10}+C_{20})$ represents the coupling capacitance between a single pixel electrode and one adjacent data line; in the array layout, each data line 140 is typically adjacent to two pixel electrodes 140. The ratio of the amplifier integration time to line scan time is relatively small, about 0.85. In continuous fluoroscopy, or in pulsed fluoroscopy if the beam on time is a significant fraction of interframe time, the size of the coupling effect is $2[(C_{10}+C_{20})/C_{pixel}]$, which ratio provide a useful way to characterize the magnitude of the capacitive coupling effect. For imagers having the construction described above with respect to FIGS. 1(A) and 1(B), the value of $2[(C_{10}+C_{20})/C_{pixel}]$ calculated from the structure or inferred from imager data is in the range of about 0.5%. This value is significant because typical contrast modulation in x-ray imagers is in the range between about 0.1% to about 10%.

Figure 2A:
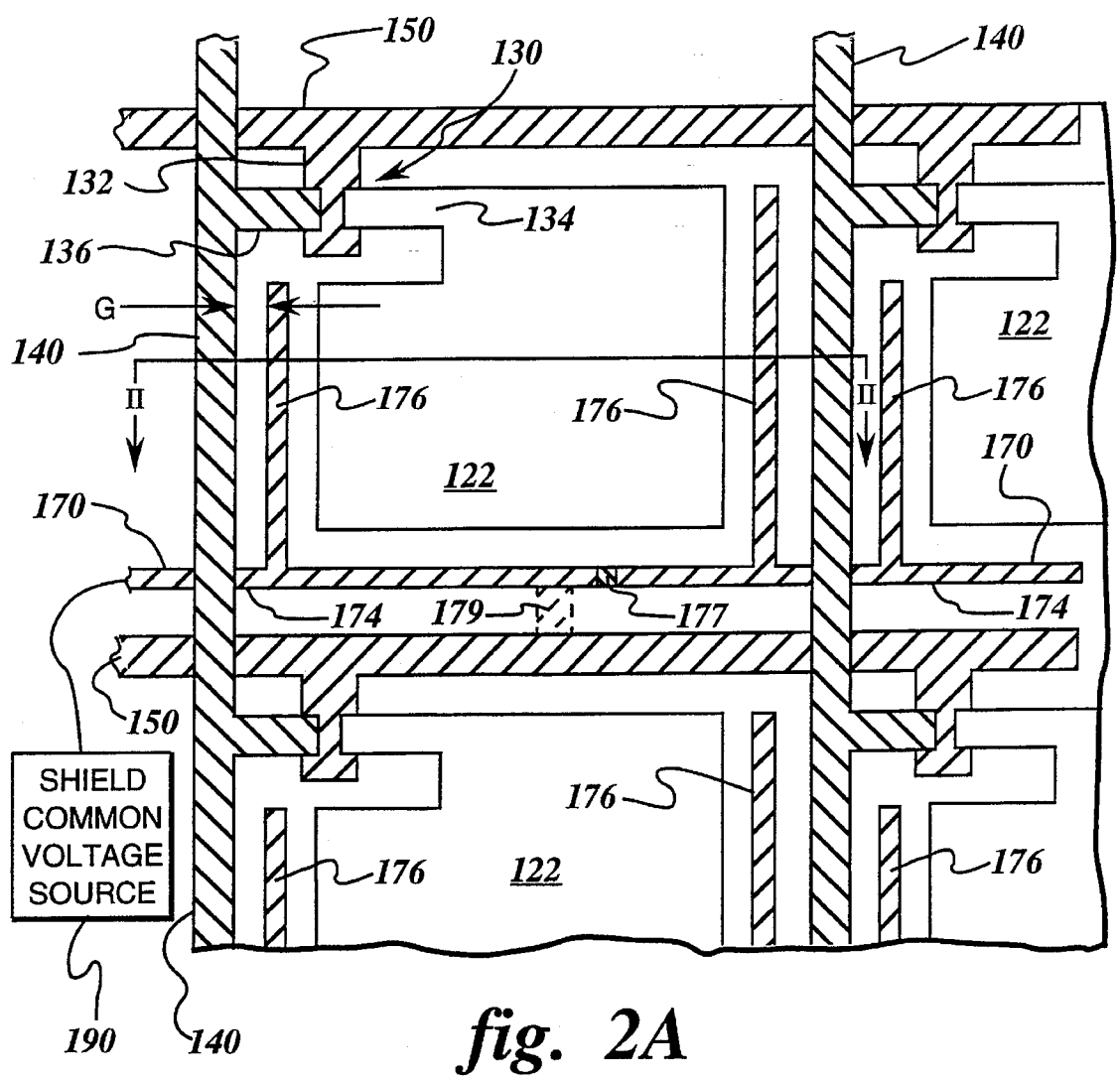
FIG. 2(A) is plan view of an imager array having shield lines in accordance with one embodiment of the present invention.
Figure 2B:
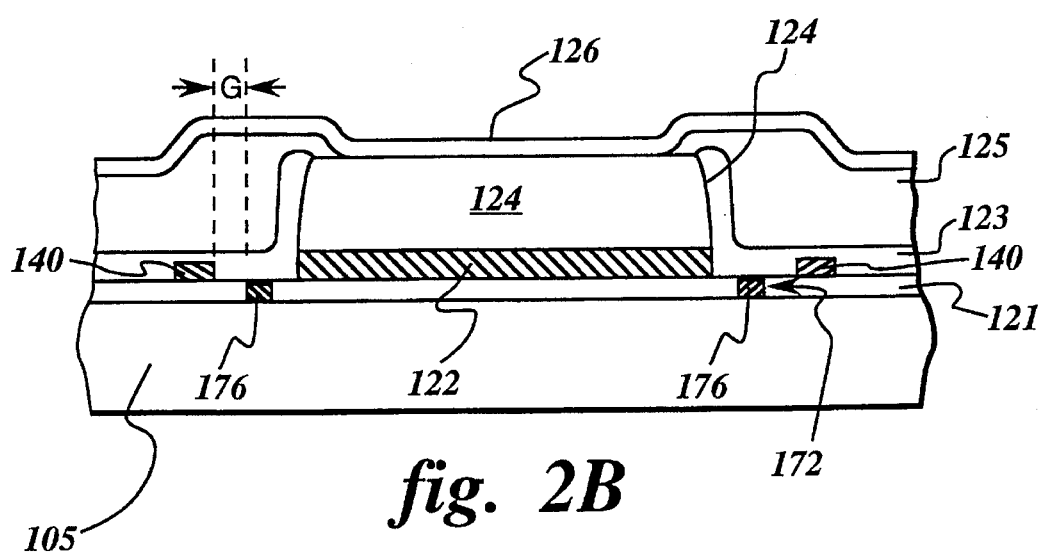
FIG. 2(B) is a partial cross-sectional view of a representative pixel taken along line II—II of FIG. 2(A) in accordance with the present invention.

In accordance with this invention, radiation imager 100 further comprises a plurality of shield lines 170 (FIGS. 2(A) and 2(B)) that are disposed so as to reduce the capacitive coupling between a pixel electrode 122 and adjacent data lines 140. Shield lines 170 are disposed at a first level 172 over substrate 105 that is the same level at which scan lines 150 are disposed over substrate 105, and typically shield lines 170 comprise the same conductive material as scan lines (e.g., molybdenum, chromium, titanium, and the like) and are formed coincidentally with the scan lines in the same metal deposition and patterning steps (thus not adding steps to the fabrication process). The structure of the present invention with shield lines 170 provides a shielding effect between the respective pixel electrodes 122 and the data lines 140 so that the induced capacitance between these components is reduced, and in particular, induced capacitance value $C_{10}$ (the "lower" path capacitance as illustrated in FIG. 1(B)) is reduced by the positioning of the shield lines at a level beneath the pixel electrode. Another approach to reduction of induced capacitance with the use of a ground plane electrode is presented in copending application Ser. No. 08/523,324, filed Sep. 5, 1996, entitled "Flat Panel Imaging Device with Ground Plane Electrode" which is assigned to the assignee of the present invention, and incorporated herein by reference.

Each shield line 170 comprises a bus portion 174 from which respective pixel shielding spurs 176 extend so as to be disposed between a pixel electrode 122 and adjacent data line portions 140. In one embodiment of the present invention that is illustrated in FIG. 2(A), shield line bus portion 174 is aligned along first axis 101 parallel to rows of pixels 110; alternatively, shield line bus portion 174 is oriented along second axis 102 parallel to columns of pixels 110.

Shielding spurs 176 are disposed so as to be separated from adjacent portions of data line 140 by a shield line gap distance "G", which distance is in the range of between about 2 µm and about 20 µm, and commonly is about 5 µm (as illustrated in FIG. 2(A), gap distance G is shortest lateral distance portions of separating shield line 170 from portions of data line 140). The minimum value of the shield line gap distance is generally limited by processing techniques (e.g., photolithographic processes) and the resolution with which conductive structures can be reliably fabricated in the imager and the maximum distance determined by considerations relating to fill factor and optimizing the portion of the array area that comprises the active area of the photodiodes.

Figure 3:
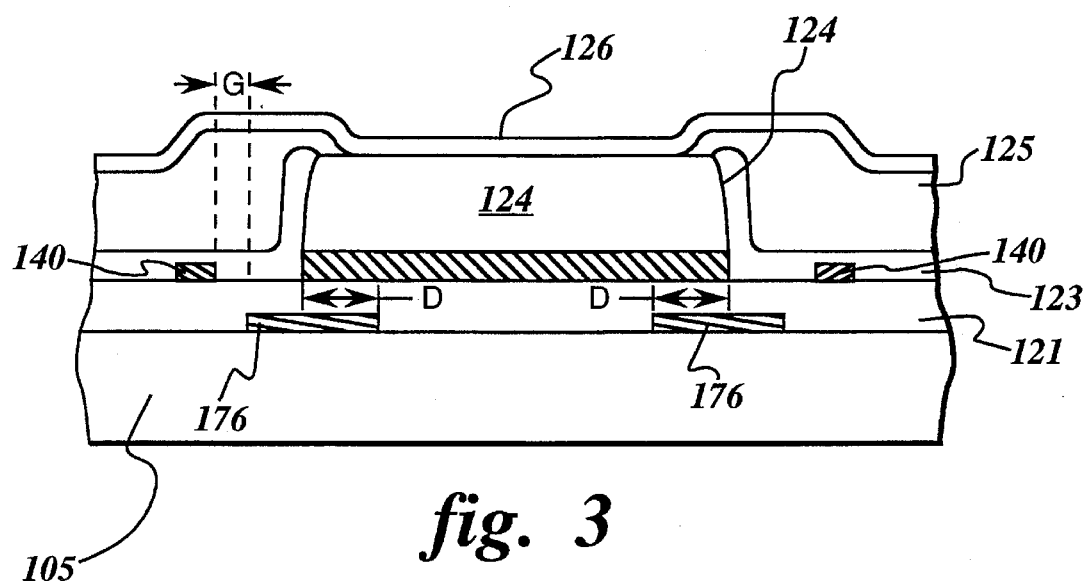
FIG. 3 is a partial cross-section view of a representative pixel in accordance with another embodiment of the present invention.

In one embodiment of the present invention, as illustrated in FIG. 2(A) and 2(B), shield line 170 is disposed such that it does not underlie any portion of pixel electrode 122. In an alternative embodiment of the present invention as illustrated in FIG. 3, shield line 170 underlies pixel electrode 122 by an overlap distance "D", which is typically in the range between about 1 µm and about 20 µm. The width of the shield spur lines can thus vary between about 2 µm and about 50 µm dependent upon the amount, if any, of overlap distance D.

In modeling analyses, the shield line structure illustrated in FIGS. 2(A) and 2(B) exhibits greatest effectiveness in reducing capacitance at relatively small shield line gap distances, e.g., less than about 5 µm. Such analyses (based on a device with a structure similar to that illustrated in FIG. 2(A) and 2(B)) suggest a reduction of capacitance between data line 140 and pixel electrode 122 from a value of about 0.1 pf/cm to a value of about 0.06 pf/cm for a gap distance of about 2 µm; and a reduction of capacitance from a value of about 0.09 pf/cm to a value of about 0.05 pf/cm for a gap distance of about 5 µm.

Disposition of portions of shield line 170 under pixel electrode 122 serves to enhance the effectiveness of shield line 170 in reducing capacitance between data line 140 and pixel electrode 122; typically a reduction of capacitance from a value of about 0.1 pf/cm to a value of about 0.001 pf/cm for a gap distance of about 5 µm.

Shield lines 170 are further coupled to a shield common voltage source 190 (FIG. 2(A)). Shield common voltage source 190 maintains the shield line (and the shield line spurs attached thereto) disposed around a pixel that is being addressed at a fixed potential. In the arrangement illustrated in FIG. 2(A), each shield line is coupled to voltage source 190 such that all shield lines are maintained at the same constant potential during array operation. The presence of the shield lines tends to disrupt electric field lines between pixel electrode 122 and data line 140, thus reducing the capacitance between those two components of the imager array. Alternatively, shield common voltage source 190 comprises the same voltage source used for array common electrode 126, and shield lines are coupled to common electrode 126 through vias 177 (a representative one of which is illustrated in FIG. 2(A); for ease of illustration alternative embodiments are shown in one figure, although typically only one type of connecting structure would be used in a given imaging array) opened in the array to provide a conductive path between shield line 170 at the first level of the array and the common electrode material (typically indium tin oxide) disposed over the photodiode structures. Alternatively, shield lines 170 can be coupled to an adjoining pixel's scan line 150 by a coupling piece 179 (illustrated in phantom in FIG. 2A) such that the shield lines for a given row of pixels is maintained at the same potential as a scan line for another row of pixels, typically the next adjoining row of pixels. In this way, the shield line is held at a constant potential while a particular row of pixels is being addressed; the shield line will undergo a change in potential when the scan line to which it is coupled is addressed, but at that time the particular row of pixels that is shielded by that shield line is not being addressed.

The shield line structure of the present invention thus enhances imager performance by reducing induced capacitance between data lines and pixel electrodes, thereby reducing phantom images or image artifacts in images.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A solid state radiation imager for generating images with reduced image artifacts during read-out of the imager and having components disposed in levels above a substrate, comprising:

a plurality of pixels disposed in an imaging array pattern comprising rows and columns, each of said pixels comprising a photosensor coupled to a thin film switching transistor;

a plurality of scan lines disposed at a first level with respect to said substrate along a first axis of said imaging array pattern, each row of pixels in said imaging array pattern having a respective scan line, each of said respective scan lines being coupled to a respective gate electrode in said thin film switching transistors for each pixel disposed along the respective row of pixels in said imaging array pattern;

a plurality of data lines disposed at a second level with respect to said substrate along a second axis of said imaging array pattern, each column of pixels in said imaging array pattern having a corresponding data line, each of said respective data lines being coupled to a respective readout electrode in said thin film switching transistors for each pixel disposed along the respective column of pixels in said imaging array pattern;

a plurality of shield lines disposed at said first level with respect to said substrate and separated from adjacent portions of said data lines by a shield line gap distance, each of said shield lines further comprising respective pixel shielding spurs disposed along said second axis between portions of said pixels and adjacent portions of said data lines.

2. The imager of claim 1 wherein said pixel shielding spurs are disposed along said second axis on opposite sides of each of said pixels.

3. The imager of claim 2 wherein said shield lines comprise the same conductive material as said scan lines.

4. The imager of claim 3 wherein the width of said respective pixel shielding spurs is in the range between about 2 µm to about 50 µm.

5. The imager of claim 3 wherein said shield line gap distance is in the range between about 2 µm and 20 µm.

6. The imager of claim 3 wherein each of said pixels comprises a photosensitive active area and portions of said respective pixel shielding spurs oriented along said second axis underlie the active region of the respective pixel by a pixel overlap distance between about 1 µm and about 20 µm.

7. The imager of claim 1 wherein the shield line disposed to shield a respective row of pixels is electrically coupled to the scan line for a row of pixels other than the row said shield line is disposed to shield.

8. The imager of claim 1 wherein each of said shield lines comprises a bus portion, said respective pixel shielding spurs extending from said bus portion of said shield line.

9. The imager of claim 8 wherein said shield line bus portion is aligned along said first axis.

10. The imager of claim 8 wherein each of said shield lines disposed within said imaging array pattern is coupled to a shield voltage source such that said shielding lines are maintained at a fixed potential.

11. The imager of claim 10 wherein said radiation imager comprises a common electrode and said shield lines are coupled to said common electrode through at least one via connection.

12. The imager of claim 10 wherein said shield voltage source is disposed outside said imaging array pattern.

\* \* \* \* \*